United States Patent
Kwon et al.

(10) Patent No.: US 12,495,702 B2
(45) Date of Patent: Dec. 9, 2025

(54) FLEXIBLE ORGANIC LIGHT EMITTING ELEMENT INCLUDING ENCAPSULATION STRUCTURE

(71) Applicant: ELECTRONICS AND TELECOMMUNICATIONS RESEARCH INSTITUTE, Daejeon (KR)

(72) Inventors: Byoung-Hwa Kwon, Daejeon (KR); Chan-mo Kang, Daejeon (KR); Kukjoo Kim, Daejeon (KR); Gi Heon Kim, Daejeon (KR); Sujung Kim, Daejeon (KR); Sooji Nam, Daejeon (KR); Chunwon Byun, Daejeon (KR); Jin-Wook Shin, Daejeon (KR); Jong-Heon Yang, Daejeon (KR); Hyunsu Cho, Daejeon (KR); Sukyung Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 373 days.

(21) Appl. No.: 18/303,412

(22) Filed: Apr. 19, 2023

(65) Prior Publication Data

US 2023/0389400 A1    Nov. 30, 2023

(30) Foreign Application Priority Data

May 31, 2022    (KR) .................. 10-2022-0066718

(51) Int. Cl.
*C09D 1/00*    (2006.01)
*C09D 5/00*    (2006.01)
(Continued)

(52) U.S. Cl.
CPC .............. *H10K 59/873* (2023.02); *C09D 1/00* (2013.01); *C09D 5/002* (2013.01); *C09D 7/61* (2018.01);
(Continued)

(58) Field of Classification Search
CPC ........... H10K 59/873; H10K 2102/311; H10K 77/111; C09D 7/61; C09D 7/67; C09D 1/00; C09D 5/002; C09D 7/63
See application file for complete search history.

(56) References Cited

U.S. PATENT DOCUMENTS

| | | | |
|---|---|---|---|
| 8,389,983 B2 | 3/2013 | Seo et al. | |
| 8,921,835 B2 | 12/2014 | Lee et al. | |

(Continued)

FOREIGN PATENT DOCUMENTS

| | | | |
|---|---|---|---|
| KR | 20110067411 A | 6/2011 | |
| KR | 20130028531 A | 3/2013 | |

(Continued)

OTHER PUBLICATIONS

Byoung-Hwa Kwon et al., "Organic/Inorganic Hybrid Thin-Film Encapsulation Using Inkjet Printing and PEALD for Industrial Large-Area Process Suitability and Flexible OLED Application", ACS Appl. Mater. Interfaces, 13, 55391-55402, Nov. 10, 2021.

*Primary Examiner* — Timor Karimy
(74) *Attorney, Agent, or Firm* — Rabin & Berdo, P.C.

(57) ABSTRACT

Provided is a flexible organic light emitting element that may include a flexible substrate, a circuit element layer on the flexible substrate, an emission layer on the circuit element layer, a first encapsulation structure between the flexible substrate and the circuit element layer, and a second encapsulation structure on the emission layer, wherein the first encapsulation structure includes a first inorganic layer and a first organic layer, which are sequentially stacked on
(Continued)

an upper surface of the flexible substrate, and the first organic layer includes a first polymer nanocomposite.

13 Claims, 2 Drawing Sheets

(51) Int. Cl.
*C09D 7/40* (2018.01)
*C09D 7/61* (2018.01)
*C09D 7/63* (2018.01)
*H10K 59/80* (2023.01)
*H10K 77/10* (2023.01)
*H10K 102/00* (2023.01)

(52) U.S. Cl.
CPC ............... *C09D 7/63* (2018.01); *C09D 7/67* (2018.01); *H10K 77/111* (2023.02); *H10K 2102/311* (2023.02)

(56) References Cited

U.S. PATENT DOCUMENTS

| | | | |
|---|---|---|---|
| 9,627,647 B2 | 4/2017 | Kim et al. | |
| 9,831,468 B2 | 11/2017 | Oh et al. | |
| 2007/0285010 A1* | 12/2007 | Lee | H10K 50/14 |
| | | | 313/504 |
| 2015/0314941 A1 | 11/2015 | Ramadas et al. | |
| 2016/0148984 A1* | 5/2016 | Kim | H10K 59/12 |
| | | | 257/40 |
| 2021/0198566 A1* | 7/2021 | Hasegawa | C09K 11/025 |
| 2021/0408467 A1 | 12/2021 | Yan | |
| 2022/0278298 A1 | 9/2022 | Park et al. | |

FOREIGN PATENT DOCUMENTS

| | | |
|---|---|---|
| KR | 20140130016 A | 11/2014 |
| KR | 20150109325 A | 10/2015 |
| KR | 20160036722 A | 4/2016 |
| KR | 10-2120897 B1 | 6/2020 |
| KR | 10-2021-0016735 A | 2/2021 |

* cited by examiner

FLEXIBLE ORGANIC LIGHT EMITTING ELEMENT INCLUDING ENCAPSULATION STRUCTURE

CROSS-REFERENCE TO RELATED APPLICATIONS

This U.S. non-provisional patent application claims priority under 35 U.S.C. § 119 of Korean Patent Application No. 10-2022-0066718, filed on May 31, 2022, the entire contents of which are hereby incorporated by reference.

BACKGROUND

The present disclosure herein relates to a flexible organic light emitting element, and more particularly, to a flexible organic light emitting element including an encapsulation structure.

An organic electronic device (OED) refers to a device including an organic material layer that generates alternate current of charges using holes and electrons, and an example thereof may include a photovoltaic device, a rectifier, a transmitter, an organic light emitting diode (OLED), and the like.

In particular, in commercialization and greater use of OLED, durability is a major issue. Organic materials, metal electrodes, and the like included in OLED are highly susceptible to oxidation from external factors such as moisture. Accordingly, penetration of moisture and oxygen from the outside may be a major triggering factor for degradation in performance of an OLED element and the like, and to prevent this, studies on encapsulation structures are underway.

SUMMARY

The present disclosure provides a structure of a flexible organic light emitting diode element having an encapsulation structure with flexible and various functions.

An embodiment of the inventive concept provides a flexible organic light emitting element including a flexible substrate, a circuit element layer on the flexible substrate, an emission layer on the circuit element layer, a first encapsulation structure between the flexible substrate and the circuit element layer, and a second encapsulation structure on the emission layer, wherein the first encapsulation structure includes a first inorganic layer and a first organic layer, which are sequentially stacked on an upper surface of the flexible substrate, and the first organic layer includes a first polymer nanocomposite.

In an embodiment, the first polymer nanocomposite may include a first polymer material and first nanoparticles dispersed in the first polymer material, and the nanoparticles may include at least any one of CdSe, CdS, InP, AgS, CuInS2, GaAs, or silica.

In an embodiment, the first polymer material may include at least any one of an acryl-based polymer, a silicon-based polymer, an epoxy-based polymer, polyamide, polyimide, polycarbonate (PC), polypropylene (PP), polyacrylic acid (PAA), polyacrylate, urethane acrylate, polyester, polyethylene (PE), polystyrene (PS), polysiloxane, or polysilazane.

In an embodiment, the flexible organic light emitting element may further include a capping layer interposed between the emission layer and the second encapsulation structure, the second encapsulation structure may include a second inorganic layer and a second organic layer, which are sequentially stacked on an upper surface of the capping layer, and the second organic layer may include a second polymer nanocomposite.

In an embodiment, the flexible organic light emitting element may further include at least any one of a first protection layer interposed between the upper surface of the flexible substrate and the first inorganic layer or a second protection layer interposed between the upper surface of the capping layer and the second inorganic layer, and the first and second protection layers may each include at least any one of LiF or tris(8-hydroxyquinolinato)aluminium (AlQ3).

In an embodiment, the first and second protection layers may each have a thickness of about 20 nm to about 40 nm.

In an embodiment, the first and second inorganic layers may each include at least any one of oxide, nitride, or nitride oxide.

In an embodiment, the flexible substrate may include at least any one of a polyethylene terephthalate (PET) substrate, a polycarbonate substrate, a polyethylene naphthalate (PEN) substrate, or a polyimide substrate.

In an embodiment, the emission layer may include a first electrode, a second electrode, and a light emitting portion interposed therebetween, the first electrode and the second electrode may include at least any one of ITO, IZO, tin oxide, or graphene, and the light emitting portion may include at least any one of a polyfluorene derivative, a (poly) paraphenylenevinylene derivative, a polyphenylene derivative, a polyvinylcarbazole derivative, a polythiophene derivative, an anthracene derivative, a butadiene derivative, a tetracene derivative, a distyrylarylene derivative, a benzazole derivative, or carbazole.

In an embodiment of the inventive concept, a flexible organic light emitting element includes a flexible substrate, a circuit element layer on the flexible substrate, an emission layer on the circuit element layer, a first encapsulation structure between the flexible substrate and the circuit element layer, and a second encapsulation structure on the emission layer, wherein the first encapsulation structure includes a first protection layer, a first inorganic layer, and a first organic layer, which are sequentially stacked on an upper surface of the flexible substrate, and the first organic layer is thicker than the first protection layer and the first inorganic layer.

In an embodiment, the first protection layer may include at least any one of LiF or tris(8-hydroxyquinolinato)aluminum (AlQ3), and the first protection layer may be in contact with the flexible substrate.

In an embodiment, the flexible organic light emitting element may further include a capping layer interposed between the emission layer and the second encapsulation structure, the second encapsulation structure may include a second protection layer, a second inorganic layer, and a second organic layer, which are sequentially stacked on an upper surface of the capping layer, the second protection layer may include at least any one of LiF or tris(8-hydroxyquinolinato)aluminum (AlQ3), and the second protection layer may be in contact with the capping layer.

In an embodiment, the first organic layer may include a polymer nanocomposite, the polymer nanocomposite may include a polymer material and nanoparticles dispersed in the polymer material, the nanoparticles may include at least any one of CdSe, CdS, InP, AgS, CuInS2, GaAs, or silica, and the polymer material may include at least any one of an acryl-based polymer, a silicon-based polymer, an epoxy-based polymer, polyamide, polyimide, polycarbonate (PC), polypropylene (PP), polyacrylic acid (PAA), polyacrylate, urethane acrylate, polyester, polyethylene (PE), polystyrene (PS), polysiloxane, or polysilazane.

In an embodiment, the first protection layer may have a thickness of about 20 nm to about 40 nm.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
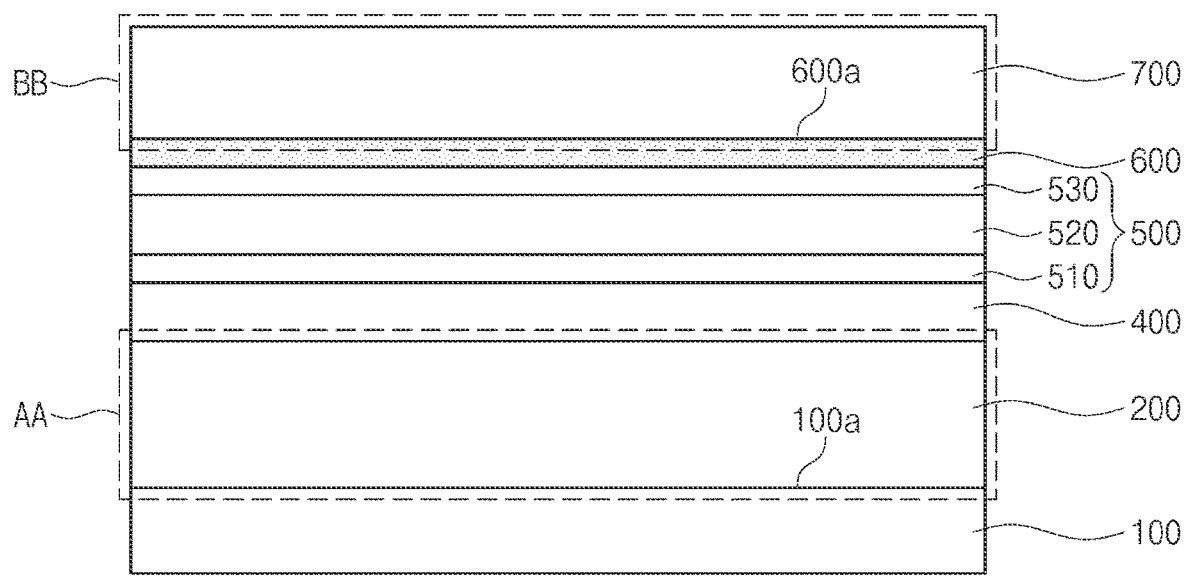
FIG. 1 is a cross-sectional view showing a flexible organic light emitting element including an encapsulation structure according to an embodiment of the inventive concept.

Advantages and features of the present disclosure and methods of accomplishing the same may be understood more readily by reference to the following detailed description of embodiments and the accompanying drawings. However, the present disclosure may be embodied in different forms, and these embodiments are provided only to make this disclosure thorough and complete and to fully convey the scope of the present disclosure to those skilled in the art, and thus the present disclosure is defined only by the scope of the appended claims. Like reference numerals denote like elements throughout the specification.

In this specification, the terms are used only for explaining embodiments while not limiting the present disclosure. As used herein, the singular forms include the plural forms as well, unless the context clearly indicates otherwise. It will be further understood that the terms "comprises" and/or "comprising", as used herein, specify the presence of stated elements, steps, operations, and/or components, but do not preclude the presence or addition of one or more other elements, steps, operations, and/or components.

Additionally, the embodiments described in this description will be explained with reference to the cross-sectional views and/or plan views as ideal example views of the present disclosure. In the drawing, the thicknesses of films and regions are exaggerated for an effective description of the technical contents. Therefore, a form of an example view may be modified by a manufacturing method and/or tolerance. Accordingly, the embodiments of the present disclosure are not limited to the specific shape illustrated in the example views, but may include other shapes that are created according to manufacturing processes. For instance, an etching region shown at a right angle may be rounded or have a predetermined curvature. Thus, regions presented as an example in the drawings have general properties, and shapes of the exemplified areas are used to illustrate a specific shape of a device region. Therefore, this should not be construed as limited to the scope of the present disclosure.

Hereinafter, a light alignment device according to an embodiment of the inventive concept will be described in detail with reference to the drawings.

Figure 2:
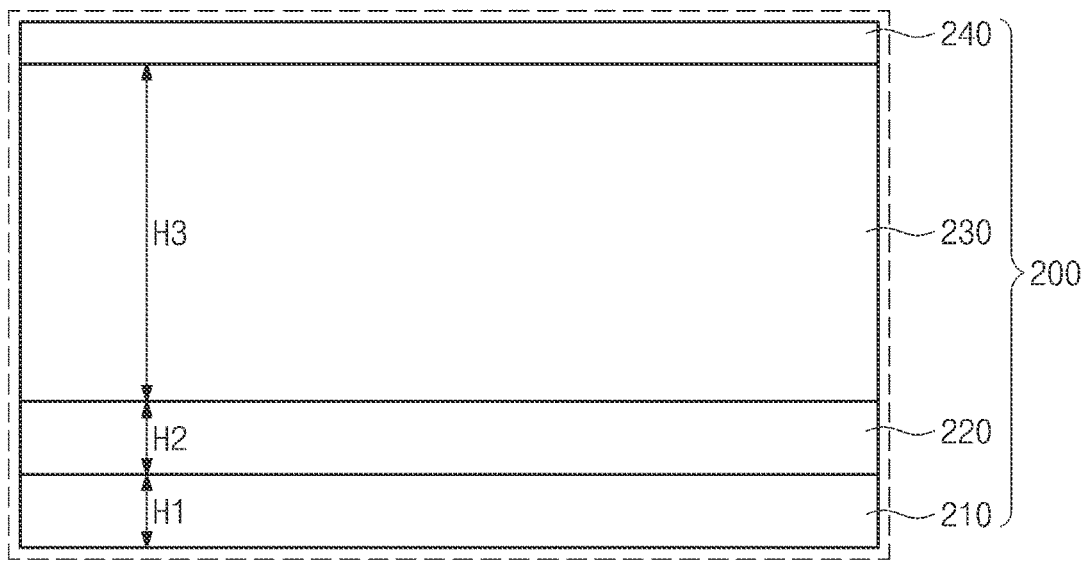
FIG. 2 is a view enlarging portion AA of FIG. 1 and is a cross-sectional view showing a first encapsulation structure.
Figure 3:
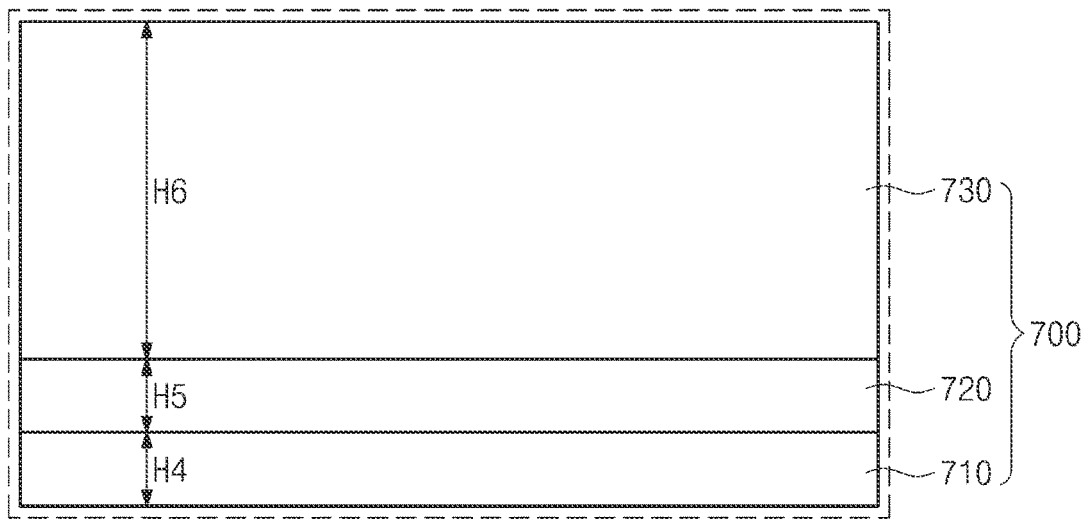
FIG. 3 is a view enlarging portion BB of FIG. 1 and is a cross-sectional view showing a second encapsulation structure.

FIG. 1 is a cross-sectional view showing a flexible organic light emitting element including an encapsulation structure according to an embodiment of the inventive concept. FIG. 2 is a view enlarging portion AA of FIG. 1 and is a cross-sectional view showing a first encapsulation structure. FIG. 3 is a view enlarging portion BB of FIG. 1 and is a cross-sectional view showing a second encapsulation structure.

Referring to FIG. 1, a flexible organic light emitting element 1 includes a flexible substrate 100, a first encapsulation structure 200, a circuit element layer 400, an emission layer 500, a capping layer 600, and a second encapsulation structure 700.

The flexible substrate 100 may be provided. The flexible substrate 100 may be a flexible plastic substrate having excellent mechanical strength, thermal stability, transparency, surface smoothness, ease of handling, and water resistance. For example, the flexible substrate 100 may include any one of a polyethylene terephthalate (PET) substrate, a polycarbonate substrate, a polyethylene naphthalate (PEN) substrate, or a polyimide substrate.

Referring to FIGS. 1 and 2, the first encapsulation structure 200 may be provided on the flexible substrate 100. The first encapsulation structure 200 may include a multi-layer structure. For example, the first encapsulation structure 200 may include a first protection layer 210, a first inorganic layer 220, a first organic layer 230, and an interlayer inorganic thin film 240, which are sequentially stacked on an upper surface 100a of the flexible substrate 100.

The first protection layer 210 may include at least any one of an inorganic material or a small molecule organic film formed through thermal evaporation, which is a type of physical vapor deposition (PVD). More specifically, the inorganic material may include a metal halide (ex: $CaF_2$), and the small molecule organic film may include tris(8-hydroxyquinolinato)aluminium (Alq3). For example, the metal halide layer may include lithium fluoride (LiF). The first protection layer 210 may have a first thickness H1. The first thickness H1 may be about 20 nm to about 40 nm. The first protection layer 210 may contact the upper surface 100a of the flexible substrate 100.

In an embodiment, an inorganic thin-film insulating layer can be additionally provided between the first protection layer 210 and the first inorganic layer 220. Alternatively, the inorganic thin-film insulating layer can be provided between the first protection layer 210 and the flexible substrate 100. The inorganic thin-film insulating layer may include oxides such as ZnO, $MoO_x$, and $WO_x$, or it may include ZnS. The inorganic thin-film insulating layer may be in contact with the first protection layer 210.

The first inorganic layer 220 may be disposed on the first protection layer 210. The first inorganic layer 220 may include any one among oxide, nitride, and nitride. For example, the oxide may include $Al_2O_3$ or $SiO_2$, the nitride may include $SiN_x$, and the nitride oxide may include $SiO_xN_y$. The first inorganic layer 220 may have a second thickness H2. The second thickness H2 may be about 20 nm to about 40 nm.

The first organic layer 230 may be disposed on the first inorganic layer 220. The first organic layer 230 may include a first polymer nanocomposite. The first polymer nanocomposite may include a first polymer material and first nanoparticles dispersed in the first polymer material.

The first polymeric material may be in the form of a matrix. The first polymer material may include at least any one of an acryl-based polymer, a silicon-based polymer, an epoxy-based polymer, polyamide, polyimide, polycarbonate (PC), polypropylene (PP), polyacrylic acid (PAA), polyacrylate, urethane acrylate, polyester, polyethylene (PE), polystyrene (PS), polysiloxane, or polysilazane.

The first nanoparticles may be dispersed in the first polymer material. The first nanoparticles may have, for example, a spherical shape or a rod shape. For example, the first nanoparticles may each have a size of about 5 nm to about 20 nm. The first nanoparticles may include at least one of CdSe, CdS, InP, AgS, CuInS$_2$, GaAs, or silica.

The first organic layer 230 may have a third thickness H3. The third thickness H3 may be greater than the first thickness H1 and the second thickness H2. For example, the third thickness H3 may be about 1 m to about 3 m.

The interlayer inorganic thin film 240 may be disposed on the first organic layer 230. The interlayer inorganic thin film 240 may include any one among oxide, nitride, and nitride. For example, the oxide may include Al$_2$O$_3$ or SiO$_2$, the nitride may include SiN$_x$, and the nitride oxide may include SiO$_x$N$_y$. The interlayer inorganic thin film 240 may have a thickness of about 20 nm to about 40 nm.

According to an embodiment of the inventive concept, the first encapsulation structure 200 may include a first protection layer 210 and a first inorganic layer 220 which have a small thickness, and a first organic layer 230 thicker than the first protection layer 210 and the first inorganic layer 220. At the same thickness, the first organic layer 230 may have greater flexibility than the first protection layer 210 and the first inorganic layer 220. As a proportion of the first organic layer 230 in the first encapsulation structure 200 is greater than that of the first protection layer 210 and the first inorganic layer 220, the overall flexibility of the first encapsulation structure 200 is may be greater.

In addition, typical encapsulation structures have only a single function of preventing penetration of moisture and oxygen, and thus are limited in application to next-generation display structures. However, the first organic layer 230 included in the first encapsulation structure 200 according to an embodiment of the inventive concept includes a first polymer nanocomposite, and may thus additionally have functions such as photoelectric conversion, moisture absorption, light scattering, and light absorption. That is, the encapsulation structure may serve various functions together instead of a single function.

The circuit element layer 400 may be disposed on the interlayer inorganic thin film 300. The circuit element layer 400 may include a thin film transistor (TFT).

The emission layer 500 may be disposed on the circuit element layer 400. The emission layer 500 may include a first electrode 510, a light emitting portion 520, and a second electrode 530. The light emitting portion 520 may be interposed between the first electrode 510 and the second electrode 530. The first electrode 510 may serve as an anode, and the second electrode 530 may serve as a cathode. The light emitting portion 520 may be formed to include a hole injection layer, a hole transporting layer, an organic emission layer, an electron transporting layer, and an electron injecting layer, but is not necessarily limited thereto.

The first electrode 510 and the second electrode 530 may be patterned conductive layers. The first electrode 510 and the second electrode 530 may be transparent electrodes. For example, the transparent electrode may include indium tin oxide (ITO), indium zinc oxide (IZO), tin oxide, graphene, or the like.

The light emitting portion 520 may include, for example, at least any one of a polyfluorene derivative, a (poly) paraphenylenevinylene derivative, a polyphenylene derivative, a polyvinylcarbazole derivative, a polythiophene derivative, an anthracene derivative, a butadiene derivative, a tetracene derivative, a distyrylarylene derivative, a benzazole derivative, or carbazole. In addition, the light emitting portion may be an organic light emitting material including a dopant. For example, the dopant may include at least any one selected from xanthene, perylene, coumarine, rhodamine, rubrene, dicyanomethylenepyran, thiopyran, (thia) pyrilium, periflanthene derivatives, indenoperylene derivatives, carbostyryl, Nile red, or quinacridone. The light emitting portion may generate light, using recombination of holes or electrons supplied from the outside.

The capping layer 600 may be disposed on the emission layer 500. The capping layer 600 may increase the light refractive index and suppress light absorption of an organic light emitting element. Accordingly, the organic light emitting element may have improved power efficiency and lifespan.

Referring to FIGS. 1 and 3, the second encapsulation structure 700 may be provided on the capping layer 600. The second encapsulation structure 700 may include a multilayer structure. For example, the second encapsulation structure 700 may include a second protection layer 710, a second inorganic layer 720, and a second organic layer 730, which are sequentially stacked with respect to the upper surface 600a of the flexible substrate 600.

The second protection layer 710 may include at least any one of an inorganic material or a small molecule organic film formed through thermal evaporation, which is a type of physical vapor deposition (PVD). More specifically, the inorganic material may include a metal halide, and the small molecule organic film may include tris(8-hydroxyquinolinato)aluminium (Alq3). For example, the metal halide layer may include lithium fluoride (LiF). The second protection layer 710 may include the same material as the first protection layer 210 or may include a different material. The second protection layer 710 may have a fourth thickness H4. The fourth thickness H1 may be about 20 nm to about 40 nm. The second protection layer 710 may contact the upper surface 600a of the capping layer 600.

The first protection layer 210 and the second protection layer 710 may be provided in the first and second encapsulation structures 200 and 700, respectively. Alternatively, any one of the first protection layer 210 and the second protection layer 710 may be omitted. This may vary depending on the design of the flexible organic light emitting element 1 to be manufactured.

The second inorganic layer 720 may be disposed on the second protection layer 710. The second inorganic layer 720 may include any one among oxide, nitride, and nitride. For example, the oxide may include Al$_2$O$_3$ or SiO$_2$, the nitride may include SiN$_x$, and the nitride oxide may include SiO$_x$N$_y$. The second inorganic layer 720 may include the same material as the first inorganic layer 22, or may include a different material. The second inorganic layer 720 may have a fifth thickness H5. The fifth thickness H5 may be about 20 nm to about 40 nm.

The second inorganic layer 720 may serve to prevent penetration of moisture and oxygen that may penetrate from above the flexible organic light emitting element 1.

The second organic layer 730 may be disposed on the second inorganic layer 720. The second organic layer 730 may include a second polymer nanocomposite. The second polymer nanocomposite may include a second polymer material and second nanoparticles dispersed in the second polymer material.

The second polymer material may be in the form of a matrix. The second polymer material may include at least any one of an acryl-based polymer, a silicon-based polymer, an epoxy-based polymer, polyamide, polyimide, polycarbonate (PC), polypropylene (PP), polyacrylic acid (PAA), polyacrylate, urethane acrylate, polyester, polyethylene (PE), polystyrene (PS), polysiloxane, or polysilazane.

The second nanoparticles may be dispersed in the polymer material. The second nanoparticles may have, for example, a spherical shape or a rod shape. For example, the second nanoparticles may each have a size of about 5 nm to about 20 nm. the second nanoparticles may include at least any one of CdSe, CdS, InP, AgS, CuInS2, GaAs, or silica. The second organic layer 730 may include the same material as the first organic layer 230, or may include a different material.

The second organic layer 730 may have a sixth thickness H6. The sixth thickness H6 may be greater than the fourth thickness H4 and the fifth thickness H5. The sixth thickness H6 may be about 1 m to about 3 m.

According to an embodiment of the inventive concept, the second encapsulation structure 700 may include a second protection layer 710 and a second inorganic layer 720 which have a small thickness, and a second organic layer 730 thicker than the second protection layer 210 and the second inorganic layer 220. At the same thickness, the second organic layer 730 may have greater flexibility than the second protection layer 710 and the second inorganic layer 720. As a proportion of the second organic layer 730 in the second encapsulation structure 700 is greater than that of the second protection layer 710 and the second inorganic layer 720, the overall flexibility of the second encapsulation structure 700 is may be greater.

In addition, typical encapsulation structures have only a single function of preventing the penetration of moisture and oxygen, and thus are limited in application to next-generation display structures. However, the second organic layer 730 included in the second encapsulation structure 700 according to an embodiment of the inventive concept includes a second polymer nanocomposite, and may thus additionally have functions such as photoelectric conversion, moisture absorption, light scattering, and light absorption. That is, the encapsulation structure may serve various functions together instead of a single function.

Meanwhile, the first and second encapsulation structures 200 and 700 include first and second protection layers 210 and 710. Accordingly, damage to a substrate, an electrode, and an organic material in a process of manufacturing the flexible organic light emitting element 1 may be more effectively prevented.

In addition, as the first encapsulation structure 200 is provided below the circuit element layer 400, the circuit element layer 400 and the emission layer 500 may be effectively protected from external factors even when a substrate and a lower material that are easily penetrated by moisture and oxygen from the outside are used. Accordingly, an organic light emitting element including various substrates or lower materials may be more readily manufactured. In particular, a flexible organic light emitting element may be more readily manufactured.

<Method for Manufacturing Flexible Organic Light Emitting Element>

Referring back to FIG. 1, first, a flexible substrate 100 may be disposed on a carrier (not shown). According to some embodiments, an adhesive layer may be interposed between the carrier and the flexible substrate 100, so that the flexible substrate 100 may be attached to the carrier.

A first encapsulation structure 200 may be formed on the flexible substrate 100. The forming of the first encapsulation structure 200 may include forming a first protection layer 210, a first inorganic layer 220, and a first organic layer 230 sequentially on an upper surface 100a of the flexible substrate 100.

The first protection layer 210 may be directly formed on the flexible substrate 100, using physical vapor deposition (PVD), chemical vapor deposition (CVD), atomic layer deposition (ALD), spin coating, spray coating, screen printing, inkjet printing, or film lamination. For example, the first protection layer 210 may be deposited to have a small thickness, using a method of plasma atomic layer deposition (PEALD).

The first inorganic layer 220 may be formed on the first protection layer 210, using physical vapor deposition (PVD), chemical vapor deposition (CVD), atomic layer deposition (ALD), spin coating, spray coating, screen printing, inkjet printing, or film lamination. For example, the first inorganic layer 220 may be deposited to have a small thickness, using a method of plasma atomic layer deposition (PEALD). In this case, the first protection layer 210 may serve to prevent the flexible substrate 100 from being damaged in the process of forming the first inorganic layer 220.

The first organic layer 230 may be formed on the first inorganic layer 220 through coating or the like. The first organic layer 230 may be formed by mixing first nanoparticles with a first polymer material in the form of a matrix. The first nanoparticles may be formed using a method of hot injection. A first polymer nanocomposite may be formed by adding the first nanoparticles to the first polymer material to cause a condensation reaction.

An interlayer inorganic thin film 240 may be formed on the first organic layer 230. The interlayer inorganic thin film 240 may be formed using the same method as the method for forming the first inorganic layer 220. The interlayer inorganic thin film 240 may prevent the first organic layer 230 from being damaged in the process of manufacturing a circuit element layer 400 and an emission layer 500 which will be described later.

Thereafter, the circuit element layer 400, the emission layer 500, and a capping layer 600 may be sequentially formed on the first encapsulation structure 200.

Then, the second encapsulation structure 700 may be formed on the capping layer 600.

The forming of the second encapsulation structure 700 may include forming a second protection layer 710, a second inorganic layer 720, and a second organic layer 730 sequentially on an upper surface 600a of the capping layer 600.

The second protection layer 710 may be formed using the same method as the method for forming the first protection layer 210. The second protection layer 710 may be directly formed on the capping layer 600. The second inorganic layer 720 may be formed on the second protection layer 710, using the same method as the method for forming the first inorganic layer 220. The second organic layer 730 may be formed on the second inorganic layer 720, using the same method as the method for forming the first organic layer 230. In this case, the second protection layer 710 may serve to prevent the circuit element layer 400 and the emission layer 500 from being damaged in the process of forming the second inorganic layer 720.

According to an embodiment of the inventive concept, an encapsulation structure may include a protection layer and an inorganic layer which have a small thickness, and may include an organic layer thicker than the protection layer and the inorganic layer. At the same thickness, the organic layer may have greater flexibility than the protection layer and the inorganic layer. As a proportion of the organic layer in the encapsulation structure is greater than that of the protection layer and the inorganic layer, the overall flexibility of the encapsulation structure may be greater.

In addition, typical encapsulation structures have only a single function of preventing penetration of moisture and oxygen, and thus are limited in application to next-generation display structures. However, the organic layer included in the encapsulation structure according to an embodiment of the inventive concept includes a polymer nanocomposite, and may thus additionally have functions such as photoelectric conversion, moisture absorption, light scattering, and light absorption. That is, the encapsulation structure may serve various functions together instead of a single function.

Meanwhile, the encapsulation structure includes a protection layer. Accordingly, damage to a substrate, an electrode, and an organic material in a process of manufacturing a flexible organic light emitting element may be more effectively prevented.

In addition, as the encapsulation structure is provided below a circuit element layer, the circuit element layer and an emission layer may be effectively protected from external factors even when a substrate and a lower material which are easily penetrated by moisture and oxygen from the outside are used. Accordingly, an organic light emitting element including various substrates or lower materials may be more readily manufactured. In particular, a flexible organic light emitting element may be more readily manufactured.

Although the embodiments of the inventive concept have been described above with reference to the accompanying drawings, those skilled in the art to which the inventive concept pertains may implement the inventive concept in other specific forms without changing the technical idea or essential features thereof. Therefore, the above-described embodiments are to be considered in all aspects as illustrative and not restrictive.

What is claimed is:

1. A flexible organic light emitting element comprising:
   a flexible substrate;
   a circuit element layer on the flexible substrate;
   an emission layer on the circuit element layer;
   a first encapsulation structure between the flexible substrate and the circuit element layer;
   a second encapsulation structure on the emission layer, and
   a capping layer interposed between the emission layer and the second encapsulation structure,
   wherein the first encapsulation structure includes a first inorganic layer and a first organic layer, which are sequentially stacked on an upper surface of the flexible substrate, and
   the first organic layer includes a first polymer nanocomposite,
   wherein the second encapsulation structure includes a second inorganic layer and a second organic layer, which are sequentially stacked on an upper surface of the capping layer, and
   the second organic layer includes a second polymer nanocomposite.

2. The flexible organic light emitting element of claim 1, wherein the first polymer nanocomposite comprises a first polymer material and first nanoparticles dispersed in the first polymer material, and
   the first nanoparticles comprise at least any one of CdSe, CdS, InP, AgS, CuInS2, GaAs, or silica.

3. The flexible organic light emitting element of claim 2, wherein the first polymer material comprises at least any one of an acryl-based polymer, a silicon-based polymer, an epoxy-based polymer, polyamide, polyimide, polycarbonate (PC), polypropylene (PP), polyacrylic acid (PAA), polyacrylate, urethane acrylate, polyester, polyethylene (PE), polystyrene (PS), polysiloxane, or polysilazane.

4. The flexible organic light emitting element of claim 1, further comprising at least any one of a first protection layer interposed between the upper surface of the flexible substrate and the first inorganic layer or a second protection layer interposed between the upper surface of the capping layer and the second inorganic layer,
   wherein the first and second protection layers each include at least any one of LiF or tris(8-hydroxyquinolinato)aluminium (AlQ3).

5. The flexible organic light emitting element of claim 4, wherein the first and second protection layers each have a thickness of about 20 nm to about 40 nm.

6. The flexible organic light emitting element of claim 4, wherein the first and second inorganic layers each comprise at least any one of oxide, nitride, or nitride oxide.

7. The flexible organic light emitting element of claim 1, wherein the flexible substrate comprises at least any one of a polyethylene terephthalate (PET) substrate, a polycarbonate substrate, a polyethylene naphthalate (PEN) substrate, or a polyimide substrate.

8. The flexible organic light emitting element of claim 1, wherein the emission layer comprises a first electrode, a second electrode, and a light emitting portion interposed therebetween,
   the first electrode and the second electrode comprise at least any one of ITO, IZO, tin oxide, or graphene, and
   the light emitting portion comprises at least any one of a polyfluorene derivative, a (poly) paraphenylenevinylene derivative, a polyphenylene derivative, a polyvinylcarbazole derivative, a polythiophene derivative, an anthracene derivative, a butadiene derivative, a tetracene derivative, a distyrylarylene derivative, a benzazole derivative, or carbazole.

9. A flexible organic light emitting element comprising:
   a flexible substrate;
   a circuit element layer on the flexible substrate;
   an emission layer on the circuit element layer;
   a first encapsulation structure between the flexible substrate and the circuit element layer; and
   a second encapsulation structure on the emission layer,
   wherein the first encapsulation structure includes a first protection layer, a first inorganic layer, and a first organic layer, which are sequentially stacked on an upper surface of the flexible substrate, and
   the first organic layer is thicker than the first protection layer and the first inorganic layer.

10. The flexible organic light emitting element of claim 9, wherein the first protection layer comprises at least any one of LiF or tris(8-hydroxyquinolinato)aluminum (AlQ3), and
    the first protection layer is in contact with the flexible substrate.

11. The flexible organic light emitting element of claim 9, further comprising a capping layer interposed between the emission layer and the second encapsulation structure,
    wherein the second encapsulation structure includes a second protection layer, a second inorganic layer, and a second organic layer, which are sequentially stacked on an upper surface of the capping layer,
    the second protection layer includes at least any one of LiF or tris(8-hydroxyquinolinato)aluminum (AlQ3), and the second protection layer is in contact with the capping layer.

12. The flexible organic light emitting element of claim 9, wherein the first organic layer comprises a polymer nanocomposite, the polymer nanocomposite comprises a polymer material and nanoparticles dispersed in the polymer material, the nanoparticles comprise at least any one of CdSe, CdS, InP, AgS, CuInS2, GaAs, or silica, and the polymer material comprises at least any one of an acryl-based polymer, a silicon-based polymer, an epoxy-based polymer, polyamide, polyimide, polycarbonate (PC), polypropylene (PP), polyacrylic acid (PAA), polyacrylate, urethane acrylate, polyester, polyethylene (PE), polystyrene (PS), polysiloxane, or polysilazane.

13. The flexible organic light emitting element of claim 9, wherein the first protection layer has a thickness of about 20 nm to about 40 nm.

* * * * *